United States Patent
Huang et al.

(10) Patent No.: US 7,423,875 B2
(45) Date of Patent: Sep. 9, 2008

(54) LIQUID-COOLING HEAT DISSIPATING DEVICE FOR DISSIPATING HEAT BY A CASING

(75) Inventors: Hsin-Sheng Huang, Taipei County (TW); Yen-Shu Chi, Taipei County (TW)

(73) Assignee: Silver-Stone Technology Co., Ltd., Taipei (TW)

( * ) Notice: Subject to any disclaimer, the term of this patent is extended or adjusted under 35 U.S.C. 154(b) by 120 days.

(21) Appl. No.: 11/474,374

(22) Filed: Jun. 26, 2006

(65) Prior Publication Data

US 2007/0297138 A1 Dec. 27, 2007

(51) Int. Cl.
*H05K 7/20* (2006.01)
(52) U.S. Cl. .................. 361/699; 361/687; 174/17 VA; 165/80.4; 165/104.33
(58) Field of Classification Search ................. 361/687, 361/698–700, 716–720; 257/E23.088; 174/15.2, 174/50, 17 VA; 165/80.4, 104.332, 104.33, 165/104.34, 299, 104.32; 62/259.2, 525
See application file for complete search history.

(56) References Cited

U.S. PATENT DOCUMENTS

| | | | | |
|---|---|---|---|---|
| 5,469,331 A | * | 11/1995 | Conway et al. | 361/716 |
| 5,822,187 A | * | 10/1998 | Garner et al. | 361/687 |
| 6,097,597 A | * | 8/2000 | Kobayashi | 361/687 |
| 6,199,401 B1 | * | 3/2001 | Haussmann | 62/525 |
| 6,504,719 B2 | * | 1/2003 | Konstad et al. | 361/698 |
| 6,643,132 B2 | * | 11/2003 | Faneuf et al. | 361/700 |
| 6,687,122 B2 | * | 2/2004 | Monfarad | 361/687 |
| 6,979,772 B2 | * | 12/2005 | Meng-Cheng et al. | 174/17 VA |
| 7,028,761 B2 | * | 4/2006 | Lee et al. | 165/104.33 |
| 7,078,619 B2 | * | 7/2006 | Chamberlain | 174/50 |
| 7,180,747 B2 | * | 2/2007 | Lee | 361/720 |
| 2001/0042616 A1 | * | 11/2001 | Baer | 165/299 |
| 2003/0128511 A1 | * | 7/2003 | Nagashima et al. | 361/687 |
| 2003/0151892 A1 | * | 8/2003 | Kondo et al. | 361/687 |
| 2004/0008490 A1 | * | 1/2004 | Cheon | 361/699 |
| 2004/0246677 A1 | * | 12/2004 | Chen | 361/697 |

* cited by examiner

*Primary Examiner*—Jayprakash N Gandhi
*Assistant Examiner*—Courtney L Smith

(57) ABSTRACT

A liquid-cooling heat dissipating device for dissipating heat by a casing includes a casing having a liquid flow channel and a heat dissipating fin, both integrally formed on a wall of the casing. The casing includes a panel having a cold connector and a hot connector. The cold connector is connected to a water tank and the hot connector is connected to the liquid flow channel. Another end of the connectors are connected to a water-cooling connector through a pipeline, and the water-cooling connector is installed at a heat source, such that the pipeline sends heated liquid to the liquid flow channel on the wall of the casing, and the heat dissipating fin on the casing dissipates the heat to the outside, and the cooled liquid is returned to the water tank and sent to the water-cooling connector on the heat source by the pipeline for repeated cycles.

6 Claims, 7 Drawing Sheets

LIQUID-COOLING HEAT DISSIPATING DEVICE FOR DISSIPATING HEAT BY A CASING

BACKGROUND OF THE INVENTION

1. Field of the Invention

The present invention relates to a liquid-cooling heat dissipating device for dissipating heat by a casing, and more particularly to a heat dissipating device employs the design of a pipeline or a heat dissipating fin integrated with a casing for quickly lowering the temperature of a heat source without the need of installing a heat dissipating device or a fan.

2. Description of the Related Art

Computer has become a very popular tool, and computer manufacturers and users usually encounter an overheat problem when the computer executes several application programs or drives several peripherals. In general, a high-temperature heat source comes from a central processing unit (CPU) on a mother board, and the quantity of such heat increases and the heat dissipating problem becomes more seriously as the performance and processing speed of the CPU improve.

Although a computer generally installs an automatic system to start a system fan for adjusting the internal temperature of the system, the heat dissipating effect is still insignificant. If a system fan is used at unspecific time with a high frequency for a long time, noise is produced and the expected effect of lowering the system temperature cannot be achieved. As a result, the execution speed of the computer becomes very slow or the computer system may even be crashed.

Since the CPU of a general computer is designed at the bottom of the computer and proximate to a desktop, therefore a system fan of a computer is also designed at a position near the CPU or adjacent to the CPU and at the bottom of the computer for dissipating the heat to the outside by the fan. Although this method is simple and easy, the effect of dissipating heat is very limited.

To overcome the foregoing shortcomings, a water-cooling heat dissipating device as shown in FIG. 1 was introduced, and the water-cooling heat dissipating system 100 includes a water-cooling connector 10 installed at the central processing unit 200, a water outlet 101 and a water inlet 102 disposed respectively on both sides of the water-cooling connector 10, wherein the water inlet 102 is connected to a water outlet 201 of a water pump 20 by a pipeline 103, and the water outlet 101 of the water-cooling connector 10 is connected to a water inlet 301 of a cooling base 30 through a pipeline 104, and the cooling base 30 is comprised of a plurality of heat dissipating fins 303, and the water outlet 302 of the cooling base 30 is connected to a water inlet 401 of a water tank 40 through a pipeline 304, and the water outlet of the water tank 40 is connected to a water inlet 202 of the water pump 20 through a pipeline 402 to form a water-cooling heat dissipating system 100.

The water pump 20 send cold water to the water-cooling connector 10 for exchanging the heated water after a heat exchange, and the hot water is flowed through the pipeline 104 into the cooling base 30 for cooling the water, and then the cool water is returned to the water tank 40 through the pipeline 304. Such repeated cycles can cool the heat source.

However, the aforementioned water-cooling heat dissipating system 100 comprises a separate water-cooling connector 10, a water pump 20, a cooling base 30 and a water tank 40 serially connected by pipelines. These components are located loosely over the place and inconvenient to use. Based on the spatial and moving convenience, the area of the cooling base 30 cannot be increased and thus it is necessary to install a fan for the heat dissipation. As a result, the heated water cannot be cooled quickly, and the noise produced by the fan makes users uncomfortable, and thus such water-cooling heat dissipating system 100 requires further improvements.

SUMMARY OF THE INVENTION

In view of the shortcomings of the prior art, the inventor of the invention based on years of experience in the related industry to conduct extensive researches and experiments, and finally invented the present invention.

Therefore, it is a primary objective of the present invention to provide a feasible solution and overcome the foregoing problems by providing a liquid-cooling heat dissipating device for dissipating heat by a casing. The device includes a casing having a liquid flow channel and a heat dissipating fin, both integrally formed on a wall of the casing. The casing includes a panel having a cold connector and a hot connector. The cold connector is connected to a water tank and the hot connector is connected to the liquid flow channel. Another end of the connectors are connected to a water-cooling connector through a pipeline, and the water-cooling connector is installed at a heat source, such that the pipeline sends heated liquid to the liquid flow channel on the wall of the casing, and the heat dissipating fin on the casing dissipates the heat to the outside, and the cooled liquid is returned to the water tank and sent to the water-cooling connector on the heat source by the pipeline for repeated cycles.

Another objective of the present invention is to provide a liquid-cooling heat dissipating device for dissipating heat by a casing that installs a pump at the water tank for expediting the liquid flow.

A further objective of the present invention is to provide a liquid-cooling heat dissipating device for dissipating heat by a casing, and the casing is an independent casing.

Another further objective of the present invention is to provide a liquid-cooling heat dissipating device for dissipating heat by a casing, and the casing could be a computer chassis for installing electronic components.

BRIEF DESCRIPTION OF THE DRAWINGS

The objectives, shape, structure, device and characteristics of the present invention will now be described in more detail hereinafter with reference to the accompanying drawings that show various embodiments of the invention, in which.

DETAILED DESCRIPTION OF THE PREFERRED EMBODIMENTS

Figure 1:
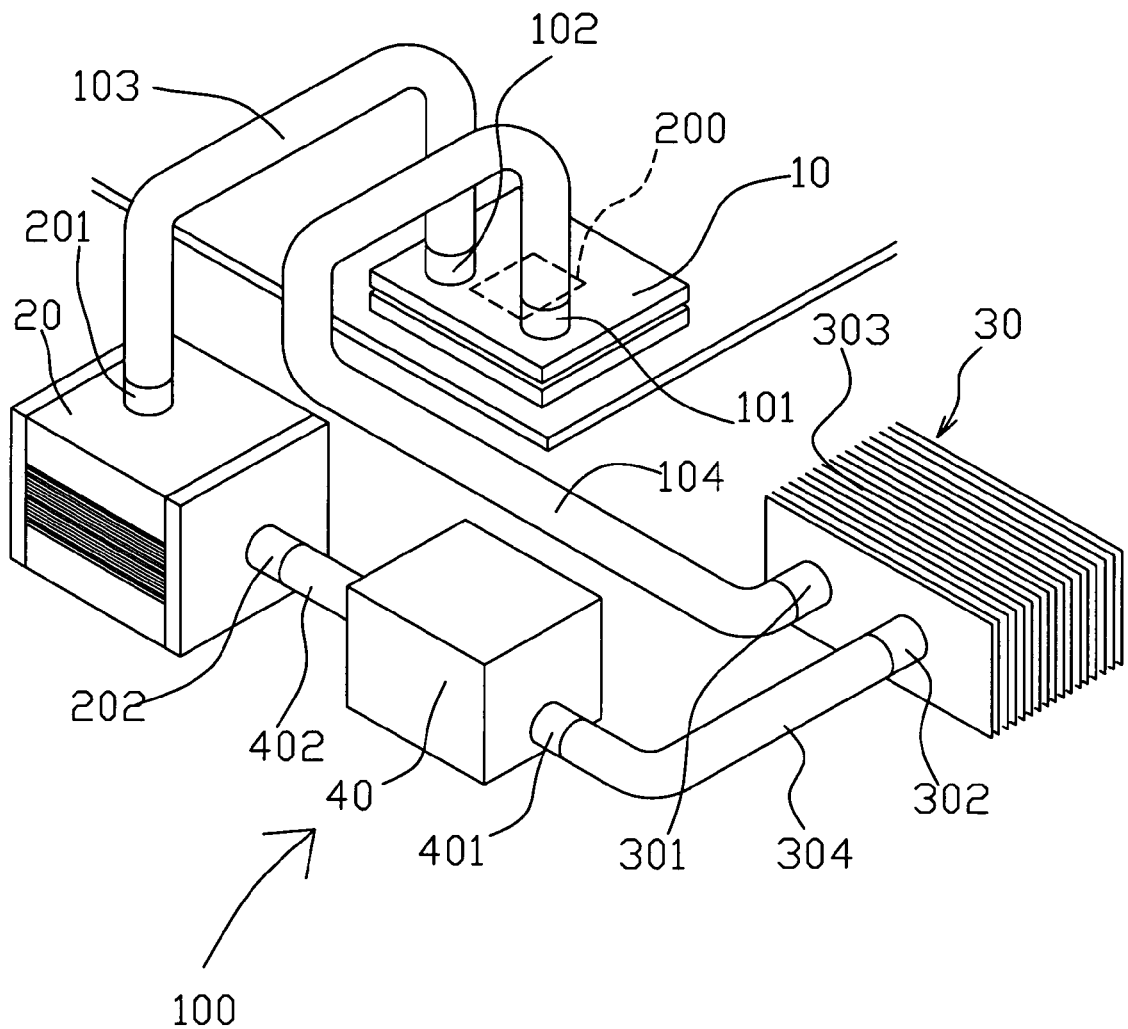
FIG. 1 is a schematic view of a prior art heat dissipating device.
Figure 2:
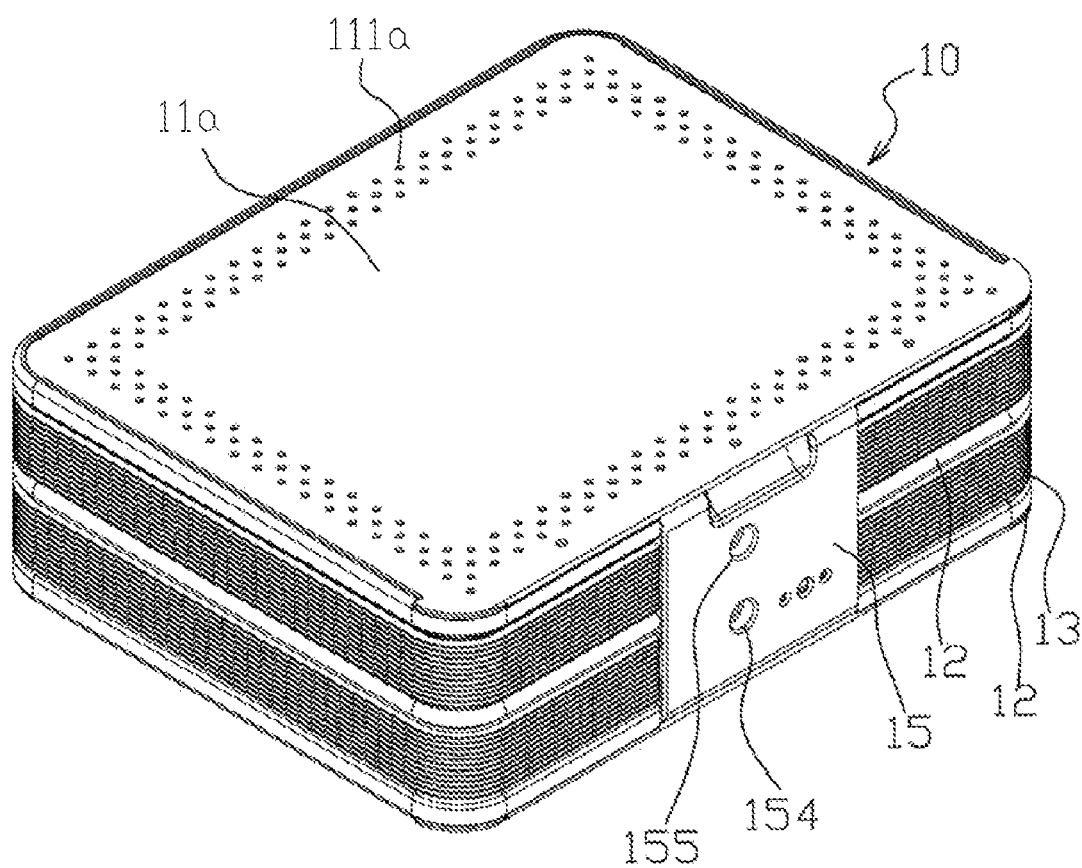
FIG. 2 is a perspective view of a first preferred embodiment of the present invention.
Figure 3:
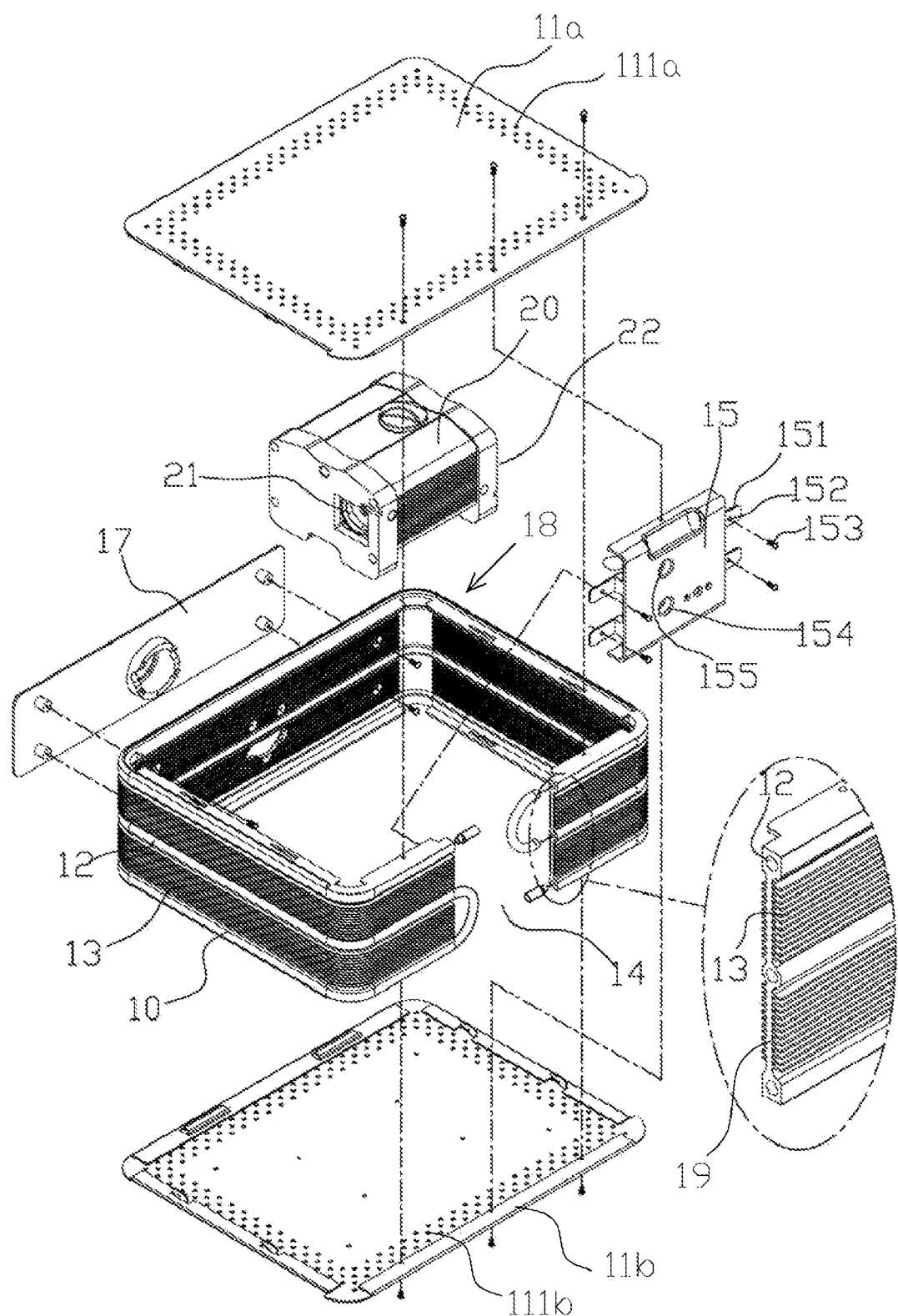
FIG. 3 is an exploded view of a first preferred embodiment of the present invention.
Figure 4:
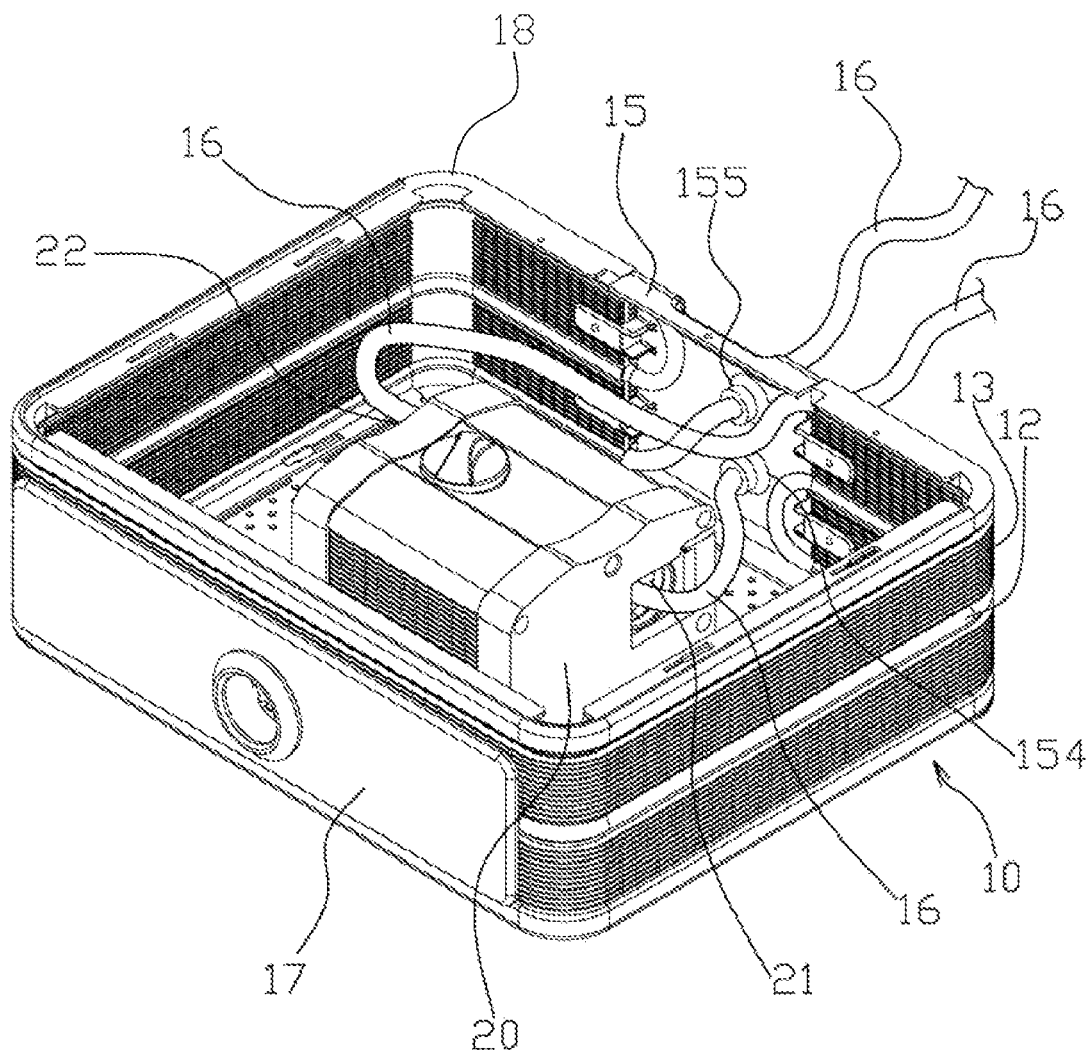
FIG. 4 is a schematic view of an assembly of a first preferred embodiment of the present invention.
Figure 5:
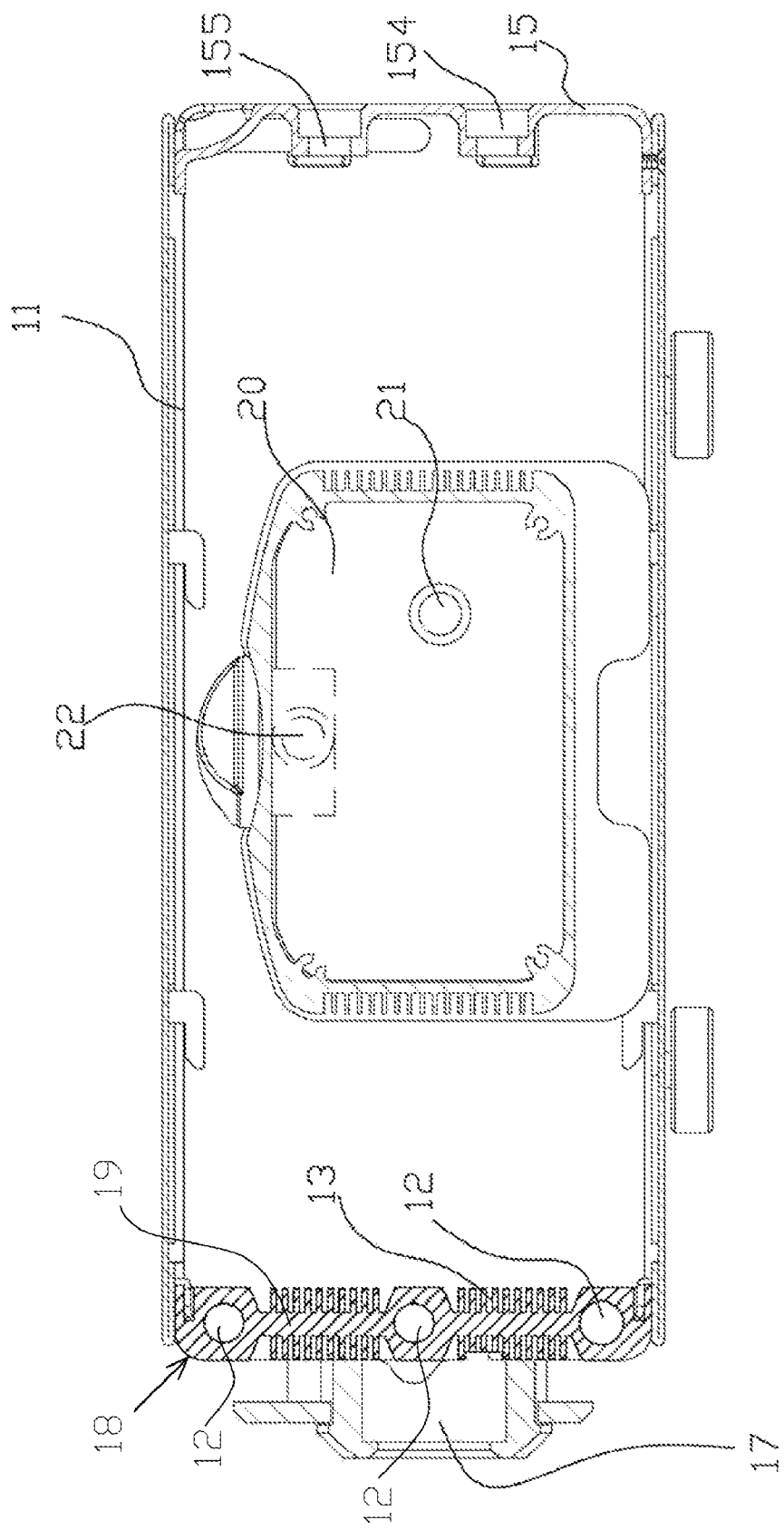
FIG. 5 is a cross-sectional view of a first preferred embodiment of the present invention.

The structure, technical measures and effects of the present invention will now be described in more detail hereinafter with reference to the accompanying drawings that show various embodiments of the invention. Referring to FIGS. 2 to 5 for a liquid-cooling heat dissipating device for dissipating heat by a casing of the present invention, the device installs a casing 10 in any shape, and the casing 10 of this embodiment is a rectangular casing. An upper and lower side of the casing 10 are secured to a cover panel 11a, 11b, respectively. The cover panels 11a, 11b provided with a plurality of ventilation holes 111a, 111b. The side wall 18 at the lateral periphery of the casing 10 is a surrounding plate 19 with a plurality of liquid flow channels 12 and heat dissipating fins 13. The liquid flow channels 12 are formed within the surrounding plate 19 parallelly and horizontally. The heat dissipating fins 13 perpendicularly extend from both sides of the surrounding plate of the side wall 18, and are parallel to the liquid flow channels 12. Further, the side wall 18 has a gap 14 disposed at a predetermined position. A panel 15 is disposed in the gap 14. A protruding ear 151 is protruded outward separately from both ends of the panel 15. The protruding ears 151 separately have a lock hole 152, such that the protruding ears 151 can be secured onto the edge of casing 10 on both sides of the gap 14 by a screw rod 153 passed through the lock hole 152. The panel 15 can be embedded into the gap 14 of the casing 10, and the panel 15 provided with a cold water connector 155 and a hot water connector 154. The hot water connector 154 is connected to an end of the liquid flow channels 12, and the cold water connector 155 is connected to a cold water outlet 21 of a water tank 20 through a pipeline 16, and the water tank 20 is used for storing a liquid (which is water in this embodiment), and the water tank 20 can install a pump (not shown in the figure) for expediting the liquid flow. Further, the water tank 20 comes with a cold water inlet 22, connected to the other end of the liquid flow channels 12.

Figure 6:
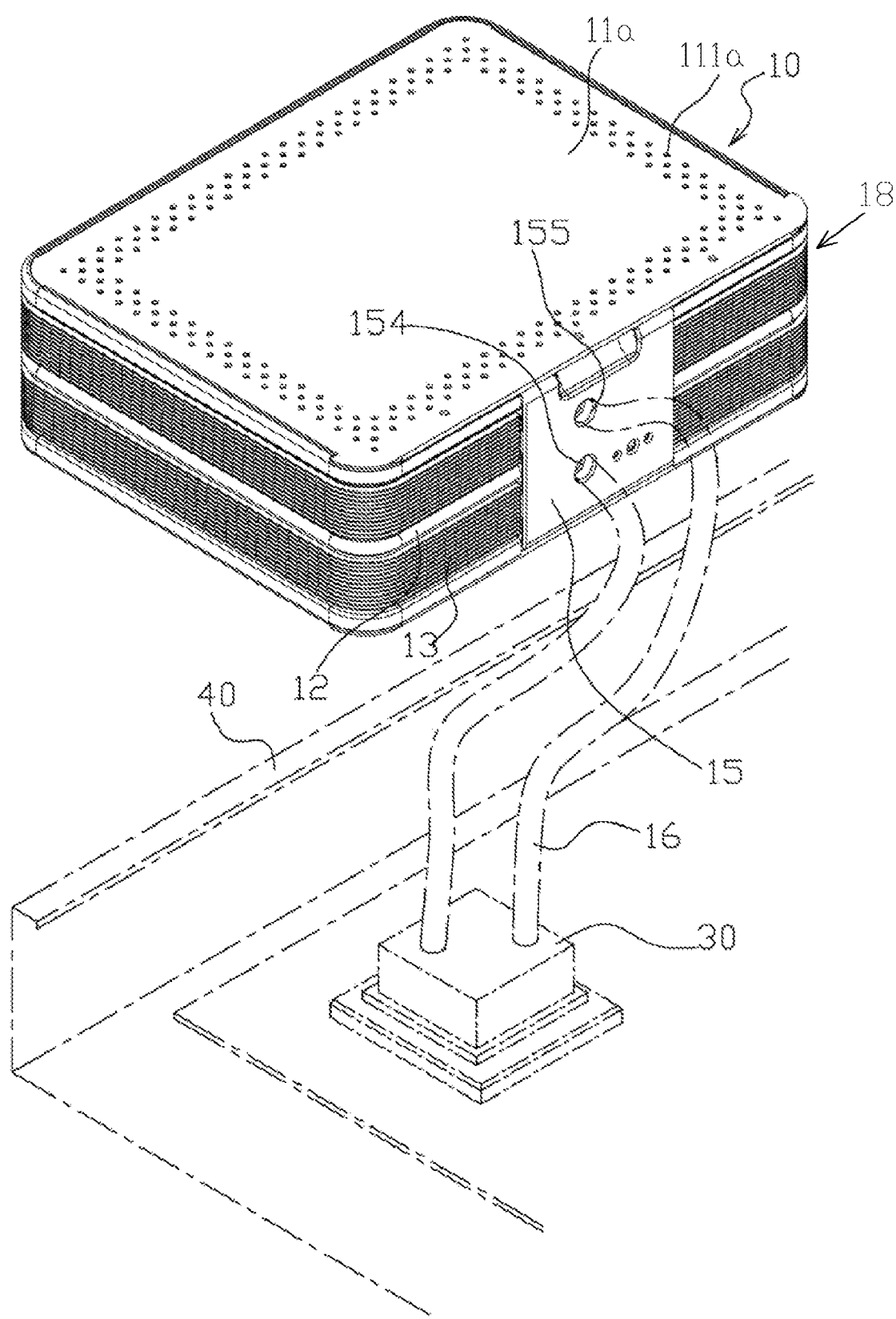
FIG. 6 is a schematic view of an application according to a first preferred embodiment of the present invention.
Figure 7:
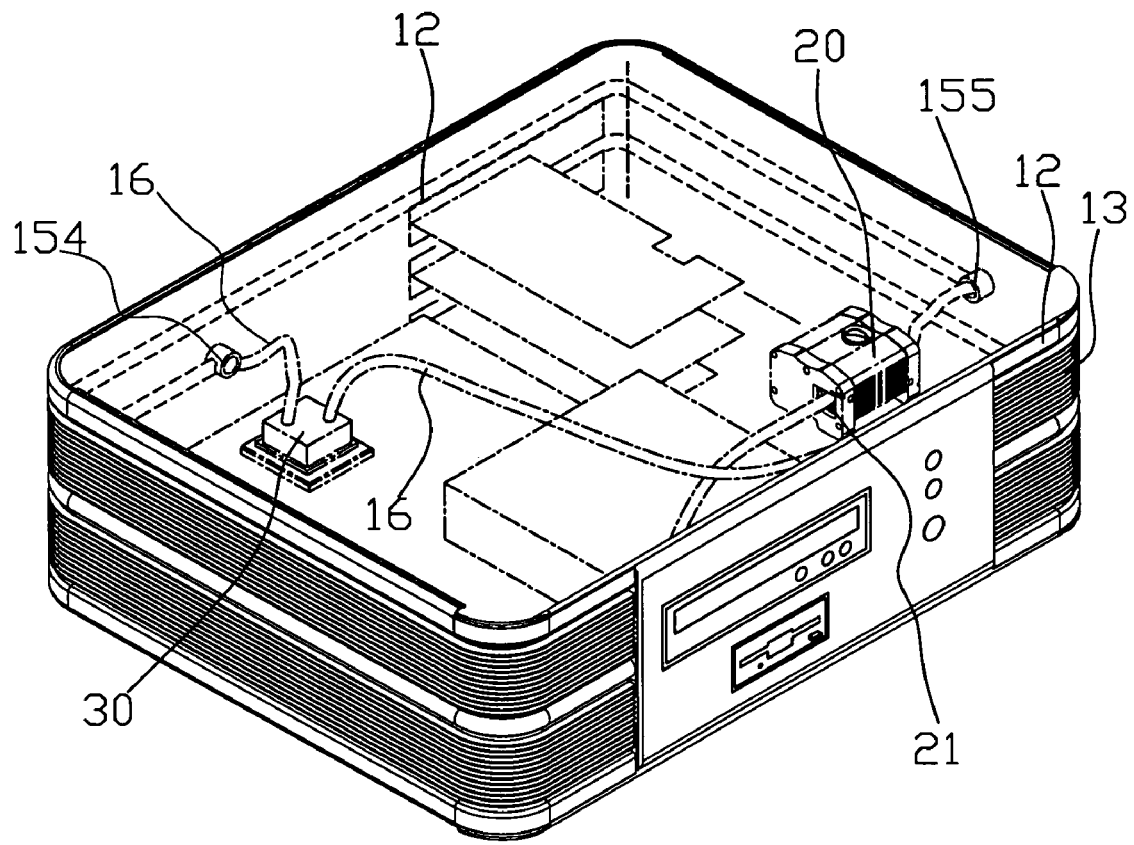
FIG. 7 is a schematic view of a second preferred embodiment of the present invention.

The cold and hot water connectors 155,154 are coupled to a water-cooling connector 30 through a pipeline 16, and the water-cooling connector 30 can be installed in the casing 10 (as shown in FIG. 7) or outside the casing 10 (as shown in FIG. 6). The casing 10 further includes a decorative panel 17 thereon for the decoration purpose. Referring to FIG. 6, the water-cooling connector 30 is installed at a heat source (such as a processor chip) in an external electronic device 40, such that the liquid heated by the heat source can be sent to the liquid flow channels 12 through the pipeline 16 and flows into the case 10. And then the heat from the heat source can be dissipated quickly to the outside through the heat dissipating fins 13 on the side wall 18 of the casing 10, and the heated liquid is returned to the water tank 20 through the cold water inlet 22 and the liquid flow channel 12, and then sent to the water-cooling connector 30 through the cold water outlet 21, cold water connector 155 and pipeline 16 for repeated cycles, so as to dissipate heat produced by a heat source quickly to the outside, and the electronic equipment such as a computer or other electronic equipments can be operated at a more stable ambient temperature and applied to any electronic equipment. Referring to FIG. 7, the water-cooling connector 30 is installed directly at a heat source (such as a processor) in the casing 10 (which could be a computer chassis), such that the liquid heated by the heat source is flowed into the liquid flow channel 12 through the pipeline 16 and the hot water connector 154, and sent to the heat dissipating fins 13 between the liquid flow channels 12, so that the heat can be dissipated quickly to the outside, and then the liquid is returned to the water tank 20 through the liquid flow channels 12 and the cold water inlet 22, and then to the water- cooling connector 30 through the cold water outlet 21, cold water connector 155 and pipeline 16 for repeated cycles, so as to dissipate the heat produced by the heat source to the outside quickly, and thus the heat will not remain at the heat source and in the casing 10.

In summation of the description above, the design of the present invention can improve the heat dissipating efficiency and overcome the shortcomings of the present invention and thus the present invention is duly submitted for the patent application. While the invention has been described by means of specific embodiments, modifications and variations could be made by those skilled in the art without departing from the scope and spirit of the invention set forth in the claims.

What is claimed is:

1. A liquid-cooling heat dissipating device comprising:
   a casing comprising:
      a surrounding plate;
      a liquid flow channel formed within said surrounding plate horizontally; and
      a plurality of heat dissipating fins perpendicularly extending from at least one side of said surrounding plate, and parallel said liquid flow channel;
   a cold water connector and a hot water connector, embedded onto said casing, and said hot connector being coupled to an end of said liquid flow channel;
   a water tank, installed in said casing and coupled separately to another end of said liquid flow channel and said cold water connector; and
   a water-cooling connector, installed at a heat source and coupled to said cold and hot water connectors by a pipeline.

2. The liquid-cooling heat dissipating device of claim 1, further comprising a panel disposed at said casing for installing said cold and hot connectors.

3. The liquid-cooling heat dissipating device of claim 1, wherein said water-cooling connector is installed in said casing.

4. The liquid-cooling heat dissipating device of claim 1, wherein said water-cooling connector is installed outside said casing.

5. The liquid-cooling heat dissipating device of claim 1, wherein said casing is a chassis for containing a system board.

6. The liquid-cooling heat dissipating device of claim 1, wherein said water tank installs a pump.

* * * * *